United States Patent
Proctor et al.

(10) Patent No.: US 9,451,717 B2
(45) Date of Patent: Sep. 20, 2016

(54) VERTICAL SLIDING DOOR FOR AN ELECTRONIC DEVICE

(71) Applicant: THOMSON LICENSING, Issy de Moulineaux (FR)

(72) Inventors: Christopher Michael William Proctor, Westfield, IN (US); Mickey Jay Hunt, Camby, IN (US)

(73) Assignee: THOMSON LICENSING, Issy les-Moulineaux (FR)

( * ) Notice: Subject to any disclaimer, the term of this patent is extended or adjusted under 35 U.S.C. 154(b) by 8 days.

(21) Appl. No.: 14/429,236

(22) PCT Filed: Aug. 14, 2013

(86) PCT No.: PCT/US2013/054840
§ 371 (c)(1),
(2) Date: Mar. 18, 2015

(87) PCT Pub. No.: WO2014/058529
PCT Pub. Date: Apr. 17, 2014

(65) Prior Publication Data
US 2015/0250069 A1 Sep. 3, 2015

Related U.S. Application Data

(60) Provisional application No. 61/711,643, filed on Oct. 9, 2012.

(51) Int. Cl.
*H05K 5/02* (2006.01)
*G06F 1/18* (2006.01)
*G11B 33/02* (2006.01)
*G11B 17/04* (2006.01)
*H05K 5/03* (2006.01)

(52) U.S. Cl.
CPC ............ *H05K 5/0239* (2013.01); *G06F 1/181* (2013.01); *G11B 17/0405* (2013.01); *G11B 33/027* (2013.01); *H05K 5/0221* (2013.01); *H05K 5/03* (2013.01)

(58) Field of Classification Search
CPC ........ H05K 7/20; H05K 5/0221; H05K 5/03; G06F 1/181; G11B 33/027
USPC ................. 361/724, 801; 312/319, 223.2
See application file for complete search history.

(56) References Cited

U.S. PATENT DOCUMENTS

| | | | |
|---|---|---|---|
| 4,840,568 A * | 6/1989 | Burroughs | H01R 24/58 361/801 |
| 5,169,218 A | 12/1992 | Chu | |
| 5,820,235 A * | 10/1998 | Tsai | G06F 1/181 312/223.2 |
| 6,062,663 A | 5/2000 | You et al. | |
| 2010/0271242 A1 | 10/2010 | Yang et al. | |

FOREIGN PATENT DOCUMENTS

| | | | | |
|---|---|---|---|---|
| EP | 0276757 | | 8/1988 | |
| EP | 1953873 | | 8/2008 | |
| GB | 2201302 | A * | 8/1988 | ........... H02G 3/0418 |

OTHER PUBLICATIONS

International Search Report for PCT/US2013/054840 dated Feb. 27, 2014.

\* cited by examiner

*Primary Examiner* — Dion R Ferguson
*Assistant Examiner* — Mandeep S Buttar
(74) *Attorney, Agent, or Firm* — Brian J. Dorini; Catherine A. Cooper

(57) ABSTRACT

An electronic device is described including a sliding vertical door, the sliding vertical door having a top, a bottom, and two vertical sides, wherein each of the two vertical sides has a locking latch at a bottom edge of each of the two vertical sides, the locking latch being between two vertical encouraging slots in each of the two vertical sides of the sliding vertical door, and wherein the siding vertical door has a front face, the front face of the sliding vertical door having a door handle positioned at, near or adjacent to the bottom of the sliding vertical door, the door handle being centered horizontally on the sliding vertical door and a sliding door bay, the sliding door bay having a bottom edge, the sliding door bay having side walls, the side walls having grooves therein.

7 Claims, 8 Drawing Sheets

VERTICAL SLIDING DOOR FOR AN ELECTRONIC DEVICE

CROSS-REFERENCE TO RELATED APPLICATIONS

This application claims the benefit, under 35 U.S.C. §365 of International Application PCT/US2013/054840, filed Aug. 14, 2013, which was published in accordance with PCT Article 21(2) on Apr. 17, 2014 in English and which claims the benefit of U.S. provisional patent application Ser. No. 61/711,643, filed Oct. 9, 2012.

FIELD OF THE INVENTION

The present invention relates to moveable coverings for components for electronic devices and in particular, for sliding door assemblies for access to otherwise covered components of electronic devices.

BACKGROUND OF THE INVENTION

In the past, electronic devices have typically used hinged doors to cover components yet allow access to the otherwise covered components. A hinged door does not afford easy access to the components of the electronic device. That is, access to the components is limited by the swing of the door and the hinge mechanism.

An alternative to using a hinged door has been to use a rib and groove door design. Rib and groove designed doors are significantly more complex in that a method would need to be devised to keep the door assembled to the bezel without easy removal. Additionally, the rib and groove designed door would also take up more space, which for some electronic devices is limited.

SUMMARY OF THE INVENTION

Applicant has recognized that there are some advantages to having vertical sliding doors for various bays in electronic devices. The bays can be for access to information cards such as smart cards, removable hard drives, disk drives, cable cards, etc. Sliding doors help to protect the bays and components therein from entry of dust, insects, liquids, etc. Sliding doors can be robust and more visually appealing than a clear view of coverless bays.

Further, a sliding door which is properly designed such as the key one disclosed herein can be more robust and take up less space than a swinging door. The reason is a swinging door needs room to rotate about its pivot point.

Additionally, with a swinging door when the door is open, access to the bay is somewhat limited by the door, because the door in the opened horizontal position will obstruct or block views and access to the bay from the top or vertical orientation. A sliding door grants better access and visibility. The sliding door could also be made translucent when configured in a stacked set of units to prevent the visual blockage of features on the unit above it.

An electronic device is described including a sliding vertical door, the sliding vertical door having a top, a bottom, and two vertical sides, wherein each of the two vertical sides has a locking latch at a bottom edge of each of the two vertical sides, the locking latch being between two vertical encouraging slots in each of the two vertical sides of the sliding vertical door, and wherein the siding vertical door has a front face, the front face of the sliding vertical door having a door handle positioned at, near or adjacent to the bottom of the sliding vertical door, the door handle being centered horizontally on the sliding vertical door and a sliding door bay, the sliding door bay having a bottom edge, the sliding door bay having side walls, the side walls having grooves therein.

BRIEF DESCRIPTION OF THE DRAWINGS

The present invention is best understood from the following detailed description when read in conjunction with the accompanying drawings. The drawings include the following figures briefly described below.

DESCRIPTION OF THE PREFERRED EMBODIMENTS

The intention is that the sliding door will not be intended for removal; however, if sufficiently forced to open, the door will detach and not break. The design takes this into consideration. The latches are molded into the door itself for a unitary design. This prevents the use of a second piece and use of an additional assembly. Another detail is centering the handle in the vertical middle of the door so the same force is applied to both sides of the door while it is opened and closed. If the handle is offset, a moment (which can be about a central pivot) can occur causing the door to angle and stick in place.

The sliding door can be assembled to the bezel to prevent the part from being misplaced and lost. The door has latches that are molded in that allow the door to hook into slots in the bezel. When the door is at vertical positions beyond the closed position and fully opened position (in which the door is still engaged in the bezel or door holding assembly), the latches are flexed inward to allow for removal from the bezel. These latches have angles on them that allow the door to be assembled to the bezel easily while the removal of the door is more difficult. The angles prevent breakage if the customer forces the door upward to remove it from the bezel.

Figure 8:
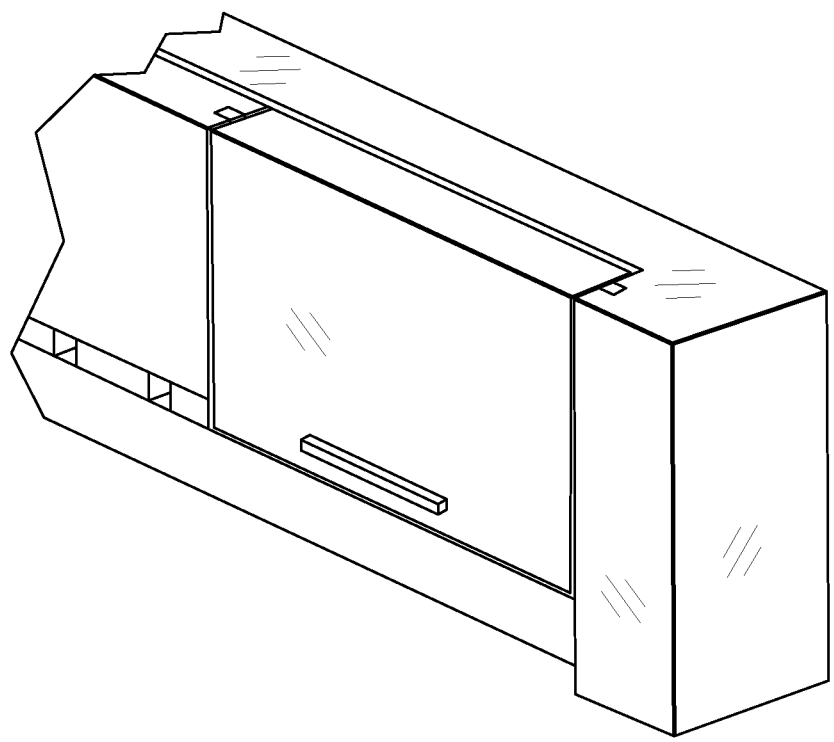
FIG. 8 is a perspective view of set top box with a rib and groove type door assembly.

It is believed that the approach of the present invention (i.e. sliding door with latches) is better than a rib and groove approach as shown in FIG. 8, which requires more complex methods to keep the door assembled to the bezel without easy removal. The rib and groove approach would also take up more space than the disclosed design.

The present invention works well in an application that prefers to keep the door as part of the bezel assembly. The angles on the latches allow easy insertion into the bezel slots and prevent breakage while resisting removal.

One may believe that the disclosed design may have a disadvantage in that the door would not be supported at the top when the door is slightly opened or fully opened, while a rib and groove type door would provide greater support to keep the door opened through greater surface area contact (i.e. the rib and groove contact is more extensive in the contact between the latch edge and the groove). However, if the door is properly fitted into the door slot, when the door is slightly opened, it can have the same feel and resistance at all vertical positions between its limits and can have similar resistances to that of the rib and groove approach when the latch is designed to have sufficient spring force on the grooves, which can be achieved through dimension selection of the door width and/or the spacing between the pair of grooves. In an embodiment of the invention, the latches are only flexed inward when the door is being completely removed (i.e. clearing the latches from the grooves) and when the door is inserted. When the door latches are in the grooves, the latches are not flexed or only flexed slightly inward (for resistance if so desired).

The latch approach of the present invention will now be further described with reference to the accompanying figures, where like reference symbols are used throughout.

Figure 1:
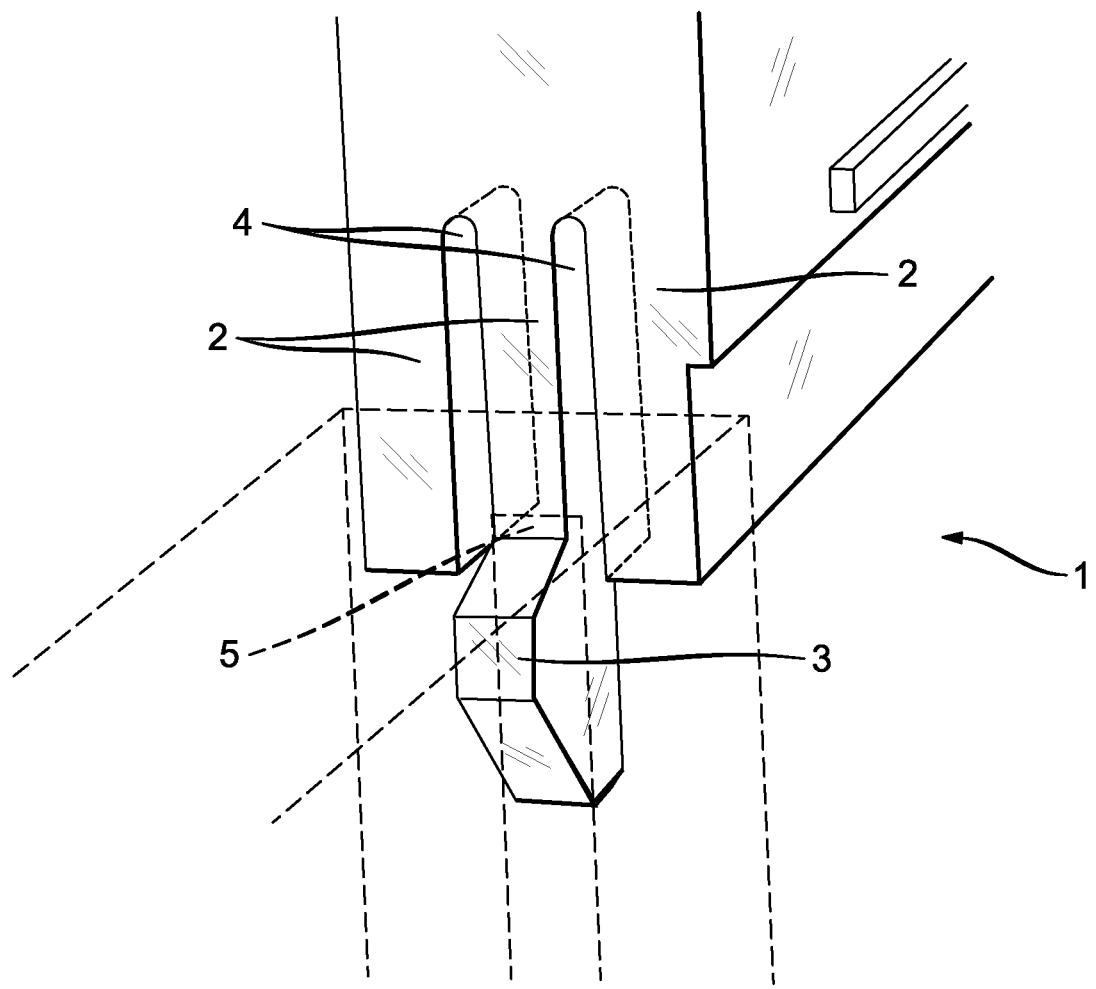
FIG. 1 is a perspective see-through view of a portion of the set top box in which a portion of the sliding vertical door and the door slot of the set top box are highlighted.

FIG. 1 is a perspective see-through view of a portion of the set top box in which a portion of the sliding vertical door and the door slot of the set top box are highlighted. This view shows how the sliding vertical door latch or clasping mechanism operates. Here, the reference signs and their corresponding features are as follows: 1—set top box or some other electronic device such as a DVR, DVD player, computer, etc; 2—sliding vertical door; 3—latch at edge and bottom of door; 4—flex encouraging slots in door narrow side; and 5—grooved edge of door slots having central groove for locking latch.

Figure 2A:
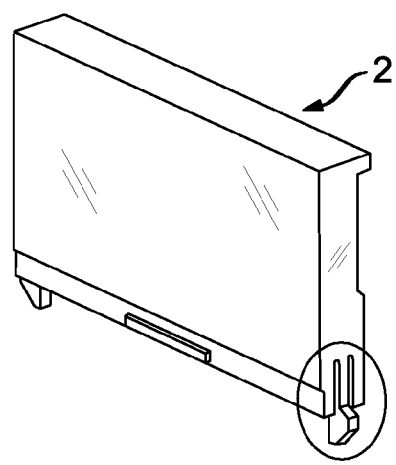
FIG. 2 shows perspective views of a portion of the set top box and the sliding vertical door and the door slot of the set top box are highlighted.
Figure 2B:
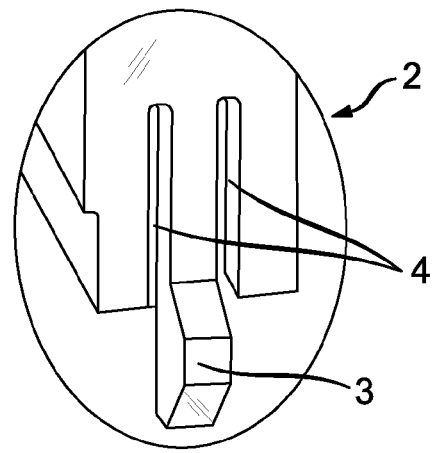
Figure 2C:
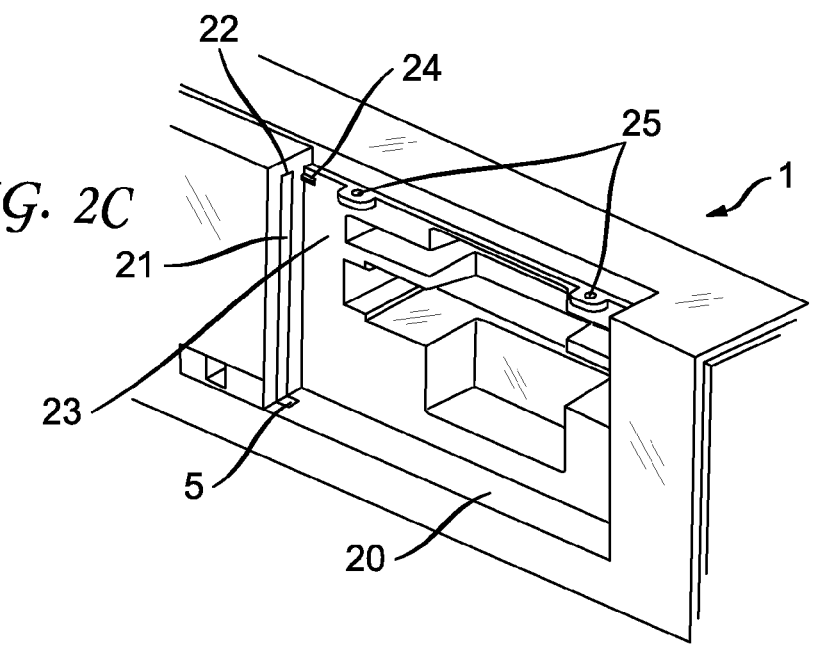

FIG. 2 shows perspective views of a portion of the set top box and the sliding vertical door and the door slot of the set top box are highlighted. This view shows how the sliding vertical door latch or clasping mechanism operates. The reference symbols that are on FIG. 1 are not repeated. In addition to the reference symbols of FIG. 1, FIG. 2 has the following reference symbols and their corresponding features are as follows: 21—the grooves into which the latches fit. The groove can extend passed the bottom ledge to the groove top portion. The groove is in a side wall of the bezel; 22—groove top portion is a stop for the door and can define the open limit (upper edge door slots prevent door from being removed and define the highest position of range); 23—bay back wall of bezel; 24—support bumps on bay back wall for supporting door in fully open position in which the top of the door can slightly pivot outward as it is lifted (because of the contour of the back side of the door) and at the upper limit the door can be positioned so the bottom edge of the rear wall (19) rests on the bump, thereby supporting the door to allow access. The support bumps can be on the side wall of the bezel instead of the bay back wall; and 25—support protrusions for supporting the door in closed position, which can have apertures. The support protrusions can also be on the side wall of the bezel instead of the bay back wall.

Figure 3:
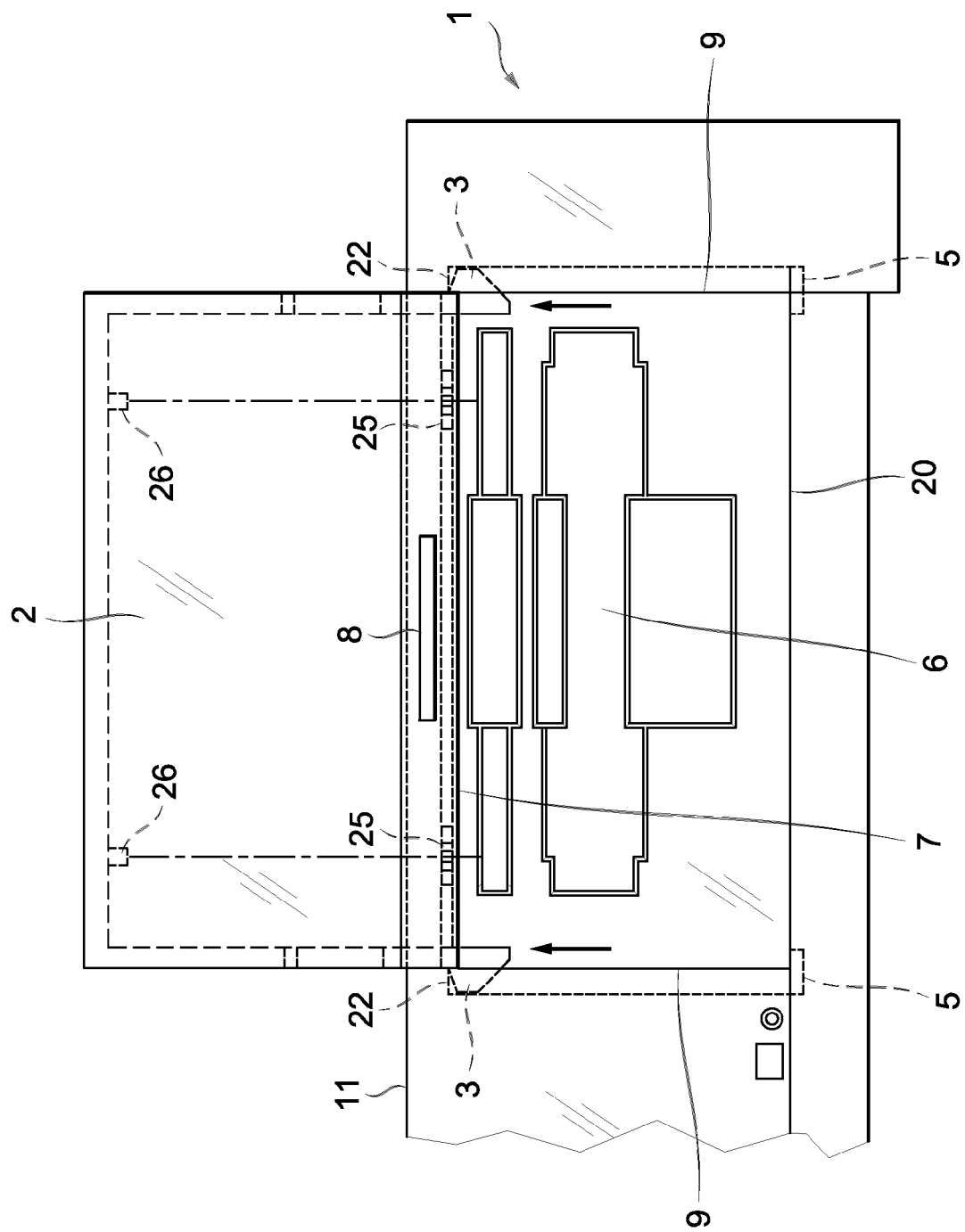
FIG. 3 is a front view of a portion of the set top box showing the sliding vertical door in the open position.

FIG. 3 is a front view of a portion of the set top box showing the sliding vertical door in the open position. The reference symbols that are on FIGS. 1 and 2 are not repeated. In addition to the reference symbols of FIG. 1 and/or FIG. 2, FIG. 3 has the following reference symbols and their corresponding features are as follows: 6—bay which will be hidden and protected by the door can be for a disk, smart card or the like; 7—door bottom edge; 8—door handle positioned at, near, or adjacent bottom of door bottom edge in which the advantage of having the handle at the bottom of the door is to ensure that any inward horizontal force that is exerted on the door is always supported by door supporting grooves or edges of the set top box and that the door does not flex. In other words, if the handle were to go far above the door supporting grooves or top of the set top box through the permissible door sliding range, then an inward horizontal force can or will bend the door backwards. As such, a key aspect of the present invention is that the handle can be positioned so that the door handle does not dramatically extend over or beyond the upper most portion of the door supporting grooves or edges or at least the top of the set top box. That is, the door handle can be vertically positioned to be somewhere within the vertical position of the slots (4) or slightly above and below the top of the set top box; 9—door supporting grooves or edges; and 26—hooks on backside of door that engage apertures of support protrusions (25) for supporting the door in closed position.

Figure 4:
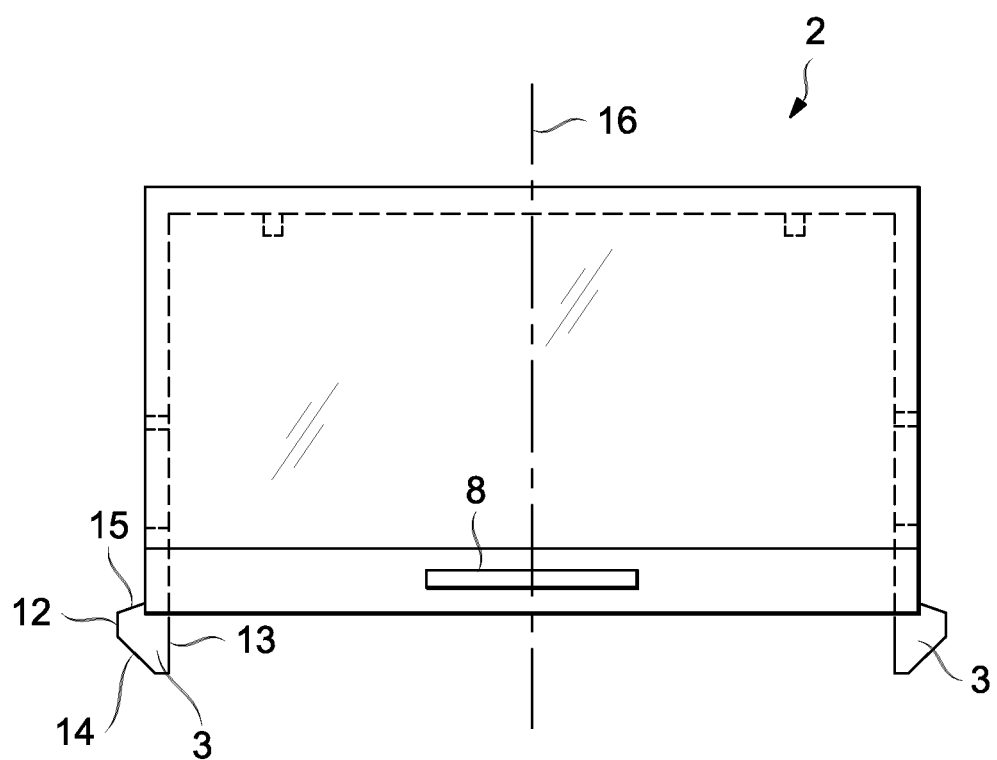
FIG. 4 is a front plan view of the sliding vertical door.

FIG. 4 is a front plan view of the sliding vertical door. The reference symbols that are on FIGS. 1-3 are not repeated. In addition to the reference symbols of FIG. 1 and/or FIG. 2 and/or FIG. 3, FIG. 4 has the following reference symbols and their corresponding features are as follows: 12—outward distal edge of latch that fits into or engages grooved edge of door slots (5) or groove (9) and face away from central vertical axis of door; 13—proximal vertical edges that face inward toward central vertical axis (16) of the door; 14—lead edge of latch below distal edge and extending inwardly from the distal edges and forms an acute angle with the proximal vertical edge and an obtuse angle with the distal edge; 15—trail edge of latch over distal edge and extending inwardly from the distal edges and forms an acute angle with the proximal vertical edge and an obtuse angle with the distal edge; however, this acute angle is larger than the one formed by the lead edge. The larger acute angle here (i.e. less aggressive angle) prevents easy removal and yet can prevent the latch from breaking if the door is forced beyond its designed limit (i.e. where the latch extends beyond the upper edge of door slots). The smaller acute angle for the lead edge (i.e. more aggressive angle) allows for easy insertion into the bezel slot or the grooved edge of door slots having central groove for locking latch (5); and 16—central vertical axis of door.

Figure 5:
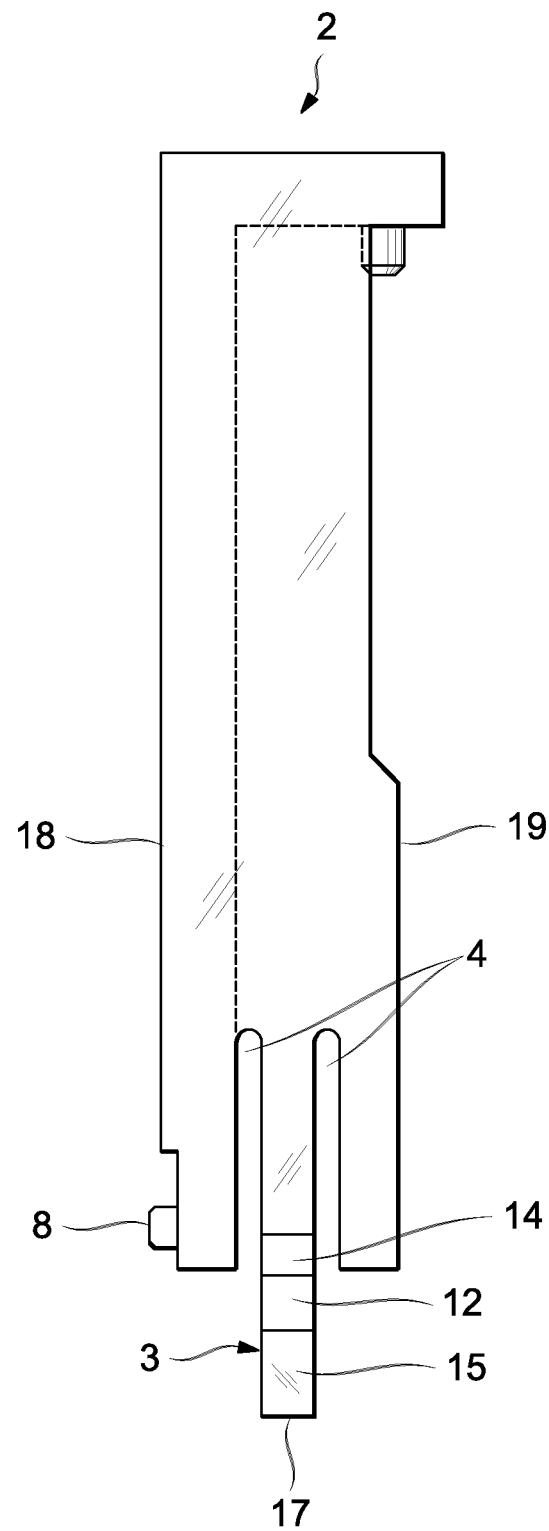
FIG. 5 is a side plan view of sliding door, which shows that the door can generally be a planar structure.

FIG. 5 is a side plan view of sliding door, which shows that the door can generally be a planar structure. The reference symbols that are on FIGS. 1-4 are not repeated. In addition to the reference symbols of FIG. 1 and/or FIG. 2 and/or FIG. 3 and/or FIG. 4, FIG. 5 has the following reference symbols and their corresponding features are as follows: 17—bottom edge of latch, which is position to promote optimal flexibility of the latches inward toward the central vertical axis of door (16). The length of the bottom edge to either or both of the of bottom edges of the front wall (18) or the rear wall is smaller than the length of the cuts or slots (4); 18—front wall or portion of door; and 19—rear wall or portion of door.

Figure 6:
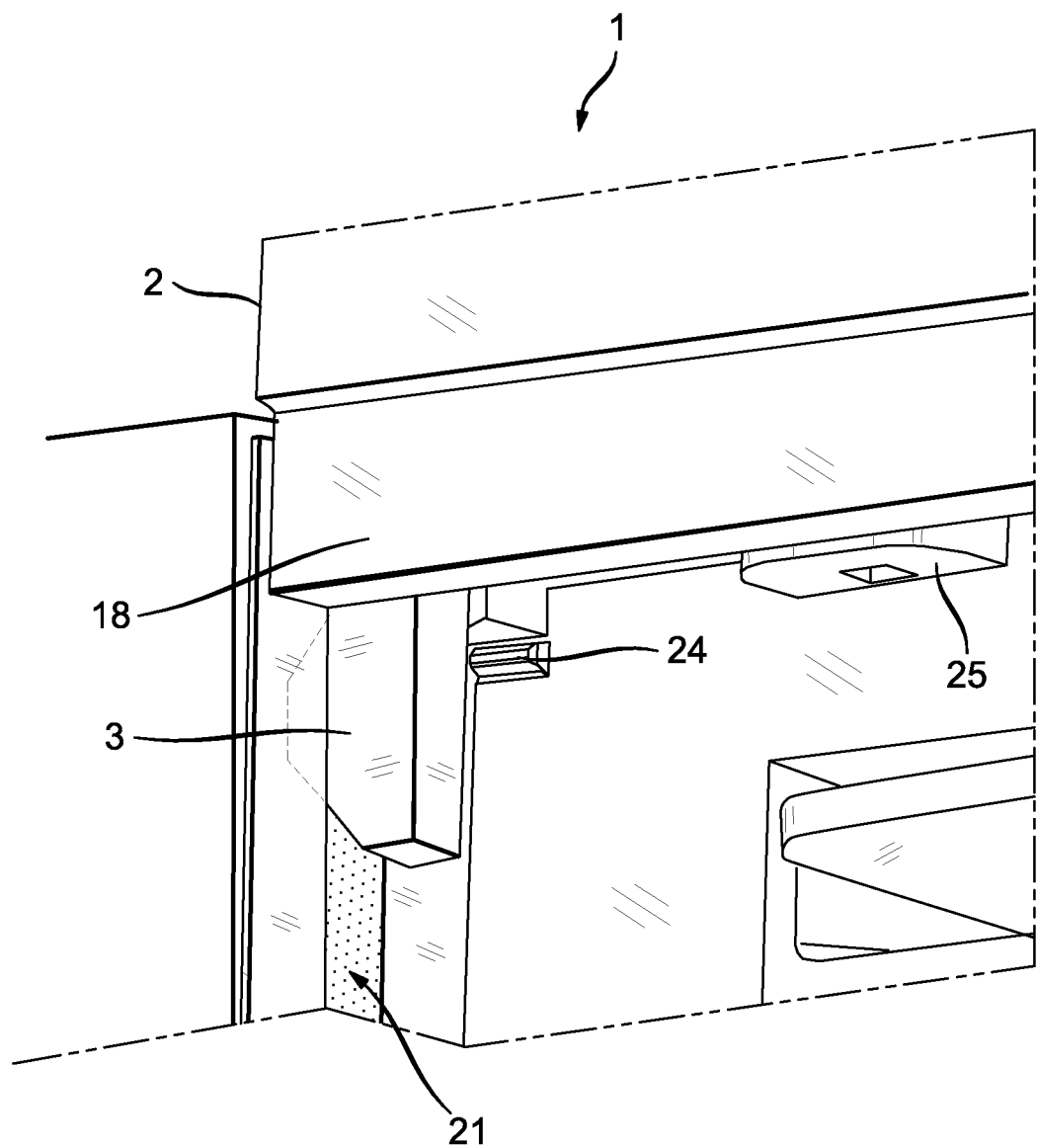
FIG. 6 is perspective view of door in the opened position.

FIG. 6 is perspective view of door in the opened position. Here, the reference signs and their corresponding features have already been defined above with respect to FIGS. 1-5

Figure 7A:
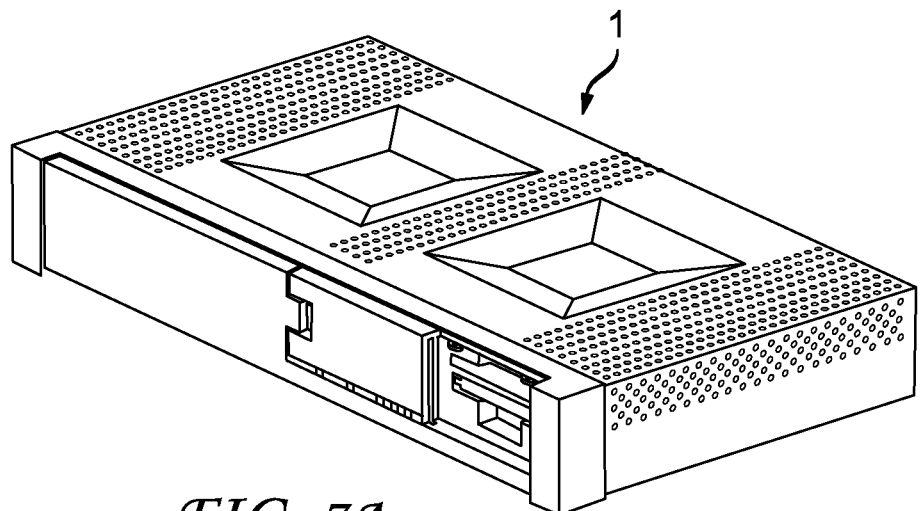
FIG. 7 is perspective views of set top box with and without the door.
Figure 7B:
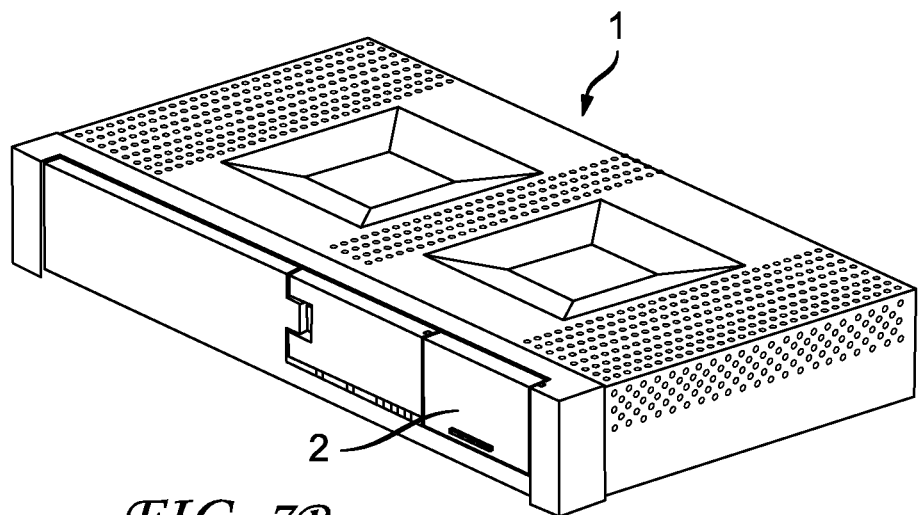

FIG. 7 is perspective views of set top box with and without the door. These views show that the groove 21 is not observed when the door is attached. As such, there is no need to hide the groove with any cover for an aesthetic appearance. Although, as shown in FIG. 7 the sliding vertical door is made of colored or tinted material such as plastic, it may also, for some applications, be made of a clear or transparent material. Clear or transparent material may be useful especially if the electronic devices are in a rack mounted assembly and it is desirable to see through the open sliding vertical door to read a display on equipment (other electronic devices) mounted above the electronic device with the open sliding vertical door or if it is desirable to see through the sliding vertical door assembly to inspect but not access the components shielded by the sliding vertical door.

FIG. 8 is a perspective view of set top box with a rib and groove type door assembly.

An electronic device (1) is described including a sliding vertical door (2), the sliding vertical door having a top, a bottom edge (7), and two vertical sides, wherein each of the two vertical sides has a locking latch (3) at a bottom edge of each of the two vertical sides, the locking latch being between two vertical encouraging slots in each of the two vertical sides of the sliding vertical door, and wherein the sliding vertical door has a front face, the front face of the sliding vertical door having a door handle (8) positioned at, near or adjacent to the bottom of the sliding vertical door, the door handle being centered horizontally on the sliding vertical door; and a sliding door bay (6), the sliding door bay having a bottom edge, the sliding door bay having side walls, the side walls having grooves (5,9) therein, each of the grooves having a central groove for engaging the locking latch of the sliding vertical door in order for the sliding vertical door to slide up and down within the central groove of the sliding door bay. The sliding door bay of the electronic device has a back wall, the back wall having apertures therein for accessing components of the electronic device to be shielded by the sliding vertical door, the back wall also having support bumps (24) formed for supporting the sliding vertical door in a fully open position, the back wall also having support protrusions (25) having apertures for supporting the sliding vertical door in a closed position, the grooves having an upper edge (22) to prevent the sliding vertical door from being removed and defining a highest position of range of the sliding vertical door, the sliding vertical door having hooks (26) on a back face of the sliding vertical door that engage the apertures of the support protrusions of the sliding door bay for supporting the sliding vertical door in a closed position. Each locking latch is trapezoidal in shape, each locking latch having an outward distal edge (12) that fits into or engages the grooves of the side walls of the sliding door bay, the distal edge facing away from a central vertical axis (16) of the sliding vertical door, each locking latch having a proximal vertical edge (13) facing inward toward the central vertical axis of the sliding vertical door, each locking latch having a lead edge (14) below the distal edge, the lead edge forming an acute angle with the proximal vertical edge and forming an obtuse angle with the distal edge, each locking latch having a trail edge (15) above the distal edge and extending inwardly from the distal edge and forming an acute angle with the proximal vertical edge and forming an obtuse angle with the distal edge. A first one of the flexible encouraging slots (4) in the sides of the sliding vertical door is between the front face of the sliding vertical door and one of the locking latches and a second one of the flexible encouraging slots in the sides of the sliding vertical door is between the one of the locking latches and the back face of the sliding vertical door. The acute angle of the trail edge of each of the locking latches is larger than the acute angle of the lead edge of each of the locking latches. Each of the locking latches has a bottom edge (17) perpendicular to the central vertical axis of the sliding vertical door.

The invention claimed is:

1. An electronic device, comprising: a sliding vertical door, said sliding vertical door having a top, a bottom, and two vertical sides, wherein each of said two vertical sides has a locking latch at a bottom edge of each of said two vertical sides, said locking latch being between two vertical encouraging slots in each of said two vertical sides of said sliding vertical door, and wherein said sliding vertical door has a front face, said front face of said sliding vertical door having a door handle positioned at, near or adjacent to said bottom of said sliding vertical door, said door handle being centered horizontally on said sliding vertical door; and a sliding door bay, said sliding door bay having a bottom edge, said sliding door bay having side walls, said side walls having grooves therein, each of said grooves having a central groove for engaging said locking latch of said sliding vertical door in order for said sliding vertical door to slide up and down within said central groove of said sliding door bay; wherein each said locking latch is trapezoidal in shape, each said locking latch having an outward distal edge that fits into or engages said grooves of said side walls of said sliding door bay, said distal edge facing away from a central vertical axis of said sliding vertical door, each said locking latch having a proximal vertical edge facing inward toward said central vertical axis of said sliding vertical door, each said locking latch having a lead edge below said distal edge, said lead edge forming an acute angle with said proximal vertical edge and forming an obtuse angle with said distal edge, each said locking latch having a trail edge above said distal edge and extending inwardly from said distal edge and forming an acute angle with said proximal vertical edge and forming an obtuse angle with said distal edge.

2. The device according to claim 1, wherein said sliding door bay has a back wall, said back wall having apertures therein for accessing components of said electronic device to be shielded by said sliding vertical door, said back wall also having support bumps formed for supporting said sliding vertical door in a fully open position, said back wall also having support protrusions having apertures for supporting said sliding vertical door in a closed position, said grooves having an upper edge to prevent said sliding vertical door from being removed and defining a highest position of range of said sliding vertical door, said sliding vertical door having hooks on a back face of said sliding vertical door that engage said apertures of said support protrusions of said sliding door bay for supporting said sliding vertical door in a closed position.

3. The device according to claim 1, wherein said sliding vertical door is colored or tinted.

4. The device according to claim 1, wherein said sliding vertical door is clear or transparent.

5. The device according to claim 1, wherein a first one of said flexible encouraging slots in said sides of said sliding vertical door is between said front face of said sliding vertical door and one of said locking latches and a second one of said flexible encouraging slots in said sides of said sliding vertical door is between said one of said locking latches and said back face of said sliding vertical door.

6. The device according to claim 2, wherein said acute angle of said trail edge of each of said locking latches is larger than said acute angle of said lead edge of each of said locking latches.

7. The device according to claim 2, wherein each of said locking latches has a bottom edge perpendicular to said central vertical axis of said sliding vertical door.

* * * * *